United States Patent
Marshall et al.

(10) Patent No.: US 9,678,132 B2
(45) Date of Patent: Jun. 13, 2017

(54) CAPACITOR COMBINATION STRESS TESTING

(71) Applicant: Texas Instruments Incorporated, Dallas, TX (US)

(72) Inventors: Andrew Marshall, Dallas, TX (US); Ping Jiang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 315 days.

(21) Appl. No.: 14/474,012

(22) Filed: Aug. 29, 2014

(65) Prior Publication Data

US 2016/0061877 A1  Mar. 3, 2016

(51) Int. Cl.
*G01R 31/02* (2006.01)
*G01R 27/26* (2006.01)
*G01R 31/00* (2006.01)

(52) U.S. Cl.
CPC ......... *G01R 31/028* (2013.01); *G01R 31/003* (2013.01); *G01R 27/2605* (2013.01)

(58) Field of Classification Search
CPC ................................ G01R 31/02; G01R 27/26
See application file for complete search history.

(56) References Cited

U.S. PATENT DOCUMENTS

| | | | |
|---|---|---|---|
| 3,378,765 A | 4/1968 | Hilsenrath et al. | |
| 3,458,803 A | 7/1969 | Maguire | |
| 3,648,165 A | 3/1972 | Shawhan | |
| 7,800,380 B1* | 9/2010 | Banaska | G01R 19/0092 324/693 |
| 2007/0191907 A1* | 8/2007 | Stein | A61N 1/37241 607/46 |
| 2009/0102490 A1* | 4/2009 | Taylor | G01R 29/26 324/613 |

FOREIGN PATENT DOCUMENTS

SU          1285401          1/1987

* cited by examiner

*Primary Examiner* — Jermele M Hollington
*Assistant Examiner* — Zannatul Ferdous
(74) *Attorney, Agent, or Firm* — John R. Pessetto; Charles A. Brill; Frank D. Cimino (57) ABSTRACT

A method of evaluating at least one parameter of a first capacitor. The method couples a number of capacitors in a capacitor network to a common node, the number of capacitors comprising at least three capacitors. Further, the method first applies a first voltage range to the capacitor network for causing a first voltage drop across the first capacitor, and it evaluates the at least one parameter in response to the first voltage range. The method second applies a second voltage range to the capacitor network for causing a second voltage drop across the first capacitor, the second voltage drop greater than the first voltage drop, and it evaluates the at least one parameter in response to the second voltage range.

17 Claims, 9 Drawing Sheets

CAPACITOR COMBINATION STRESS TESTING

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to integrated circuit capacitor measurement and testing.

The controlled and successful manufacture of integrated circuits requires evaluations, including measurement, testing, reliability, and predictability of various parameters and behavior in the manufactured devices. One particular parameter example is capacitance, including the capacitance of structures that are intended to be capacitors in the circuit function itself. Variations in capacitance may be affected or caused by manufacturing variations, temperature dependence, voltage dependence, device structure, and other manufacturing parameters and operating conditions, both in a given structure and over a population of manufactured integrated circuits, including variations in capacitance among capacitors within a given integrated circuit.

Capacitance variations and capacitor mismatch have been addressed in the design of modern analog-to-digital converters. Examples of calibration and correction techniques are described in U.S. Pat. No. 7,136,006, U.S. Pat. Nos. 6,891,486, and 8,686,744, all three of which are commonly assigned herewith, and in Tan et al., "Error Correction Techniques for High-Performance Differential A/D Converters", J. Solid-State Circ., Vol. 25, No. 6 (IEEE, 1990), pp. 1318-27, all of which are incorporated herein by reference.

For purposes of calibration, trimming, and process control, it is useful to measure capacitor behavior in manufactured devices, for example in wafer form along with functional and parametric electrical test. Additionally for such purposes, and for additional considerations such as circuit longevity, viability, and operational limit determination, stress testing of circuit elements also may be useful. Such combined aspects, therefore, are considerations addressed by the preferred embodiments.

Figure 1:
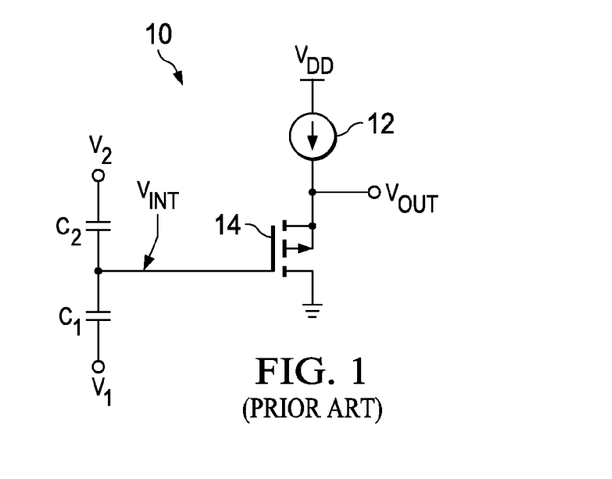
FIG. 1 illustrates a conventional circuit for measuring mismatch between capacitors $C_1$ and $C_2$.

By way of background to certain of the above considerations, FIG. 1 illustrates a conventional circuit for measuring mismatch between capacitors $C_1$ and $C_2$, that is, by evaluating the capacitance of one (or each) capacitor relative to the other. Capacitors $C_1$ and $C_2$ are connected in series between terminals $V_1$ and $V_2$. In practice, capacitor $C_2$ may be a "reference" capacitor, against which the capacitance of capacitor $C_1$ is to be measured. A node $V_{INT}$ between capacitors $C_1$ and $C_2$ is connected to the gate of a p-channel metal-oxide-semiconductor (MOS) transistor 14, the drain of which is at ground and the source of which is connected through a current source 12 to a bias voltage $V_{DD}$. The body of transistor 14 is connected to its source, in this example.

In operation, current source 12 is biased to produce a constant current $I_1$, and bias voltage $V_{DD}$ is sufficiently positive (relative to the ground voltage at the drain of transistor 14) to place transistor 14 in saturation. As well-known in the art, transistor 14 operates as a "source follower" under those conditions; because transistor 14 is in saturation, the constant source-drain current $I_1$ forces the transistor gate-to-source voltage $V_{GS}$ to be constant. As such, ideally output voltage $V_{OUT}$ (or, designated over time, $V_{OUT}(t)$) at the source of transistor 14 follows changes in the voltage at its gate, which is at node $V_{INT}$.

To perform measurement of the relative capacitances of capacitors $C_1$ and $C_2$, the voltage at node $V_2$ is held constant (e.g., at ground) and the voltage at node $V_1$ is ramped over time, that is, increased linearly from a starting voltage (e.g., ground) to a higher voltage. The voltage at intermediate node $V_{INT}$ will respond to the ramped voltage $V_1$ by also ramping, but at a flatter slope according to the voltage divider of capacitors $C_1$ and $C_2$, as shown in Equation 1:

$$V_{INT}(t) = V1(t) \cdot \left(\frac{C_1}{C_1 + C_2}\right) \qquad \text{Equation 1}$$

In other words, Equation 1 defines the slope the expected increasing voltage at node $V_{INT}$ as $$\left(\frac{C_1}{C_1 + C_2}\right).$$

Moreover, and also ideally, the slope of the output voltage $V_{OUT}$ from the source follower of transistor 14 increases with this same slope as the ramping voltage $V_{INT}(t)$, that is, the expected slope for the rise of $V_{OUT}$ is as shown in Equation 2:

$$S = \frac{C_1}{C_1 + C_2} \qquad \text{Equation 2}$$

As a result of the preceding, in response to the ramped voltage at node $V_1$, the voltage $V_{OUT}(t)$ may be measured and its slope determined, from which the capacitances of capacitors $C_1$ and $C_2$ can be determined according to the following Equation 3:

$$\frac{C_2}{C_1} = \frac{(1-S)}{S} \qquad \text{Equation 3}$$

From Equation 3, therefore, if nominally the capacitances of capacitors $C_1$ and $C_2$ are equal, then ideally the ratio of Equation 3 will equal one; or, if the nominal capacitances are accurate, then the ideal ratio thereof should be confirmed by that Equation and by evaluating the slope of $V_{OUT}(t)$. In practice, however, the behavior of the source follower circuit of FIG. 1 is not ideal, especially in modern sub-micron transistors. In the circuit of FIG. 1, the drain-to-source voltage of transistor 14 changes as the voltage at node $V_{INT}$ (and $V_{OUT}$, at the transistor source) increases. This modulation of the drain-to-source voltage causes some of the changes in the gate voltage to be consumed in charging or discharging parasitic junction capacitances in the device. Furthermore, due to the mechanism of drain-induced barrier lowering, transistor threshold voltages modulate in response to changes in drain-to-body node voltage. These effects cause the slope of output voltage $V_{OUT}(t)$ to not solely reflect the relative capacitances of capacitors $C_1$ and $C_2$, but the ratio also will reflect capacitive effects and also variations in the threshold voltage of transistor 14 over the duration of the measurement. The resulting output voltage $V_{OUT}(t)$ will thus include non-linearities, which can be substantial. The resulting inaccuracy in capacitance measurement is incompatible with capacitors such as those intended for certain precision circuits.

In consideration of certain of the above, and co-owned with the present patent application, one skilled in the art is invited to review U.S. Pat. No. 8,686,744, which is hereby incorporated herein by reference. This U.S. Pat. No. 8,686,744 describes at least one preferred embodiment that also connects a node, existing between two series-connected capacitors, to a source follower transistor configuration, for purposes of testing for a mismatch in the capacitance value of the two capacitors. More specifically, a first ramping voltage source is applied across the two capacitors, while a second ramping voltage source, which increases at one half the rate of the first voltage source, is applied to the drain of the source follower. At the same time, the output of the source follower is monitored, which will provide a first slope proportional to a first of the two capacitors. The ratio, therefore, of the first slope to the second slope may be evaluated to determine whether there is a match of the capacitance value of the two capacitors.

By way of further background, capacitor reliability is an additional consideration in circuit design, use, and for purposes of establishing operational specifications. Various models and testing have been used in view of these considerations, where certain such models are typically based on dielectric breakdown. Testing also is sometimes attempted, but accurate measurement of small capacitance shift under electrical stress is difficult and there is very limited data available on how capacitors degrade over time.

Given the preceding, the present inventors have identified numerous limitations and potential improvements to the prior art, as are further detailed below.

BRIEF SUMMARY OF THE INVENTION

In a preferred embodiment, there is a method of evaluating at least one parameter of a first capacitor. The method couples a number of capacitors in a capacitor network to a common node, the number of capacitors comprising at least three capacitors. Further, the method first applies a first voltage range to the capacitor network for causing a first voltage drop across the first capacitor, and it evaluates the at least one parameter in response to the first voltage range. The method second applies a second voltage range to the capacitor network for causing a second voltage drop across the first capacitor, the second voltage drop greater than the first voltage drop, and it evaluates the at least one parameter in response to the second voltage range.

Numerous other inventive aspects are also disclosed and claimed.

BRIEF DESCRIPTION OF THE SEVERAL VIEWS OF THE DRAWING

FIG. 7 illustrates a plot of example signals from the configuration of FIG. 5a.

DETAILED DESCRIPTION OF EMBODIMENTS

FIG. 1 was discussed above in the Background Of The Invention section of this document, and the reader is assumed to be familiar with that discussion.

Figure 2:
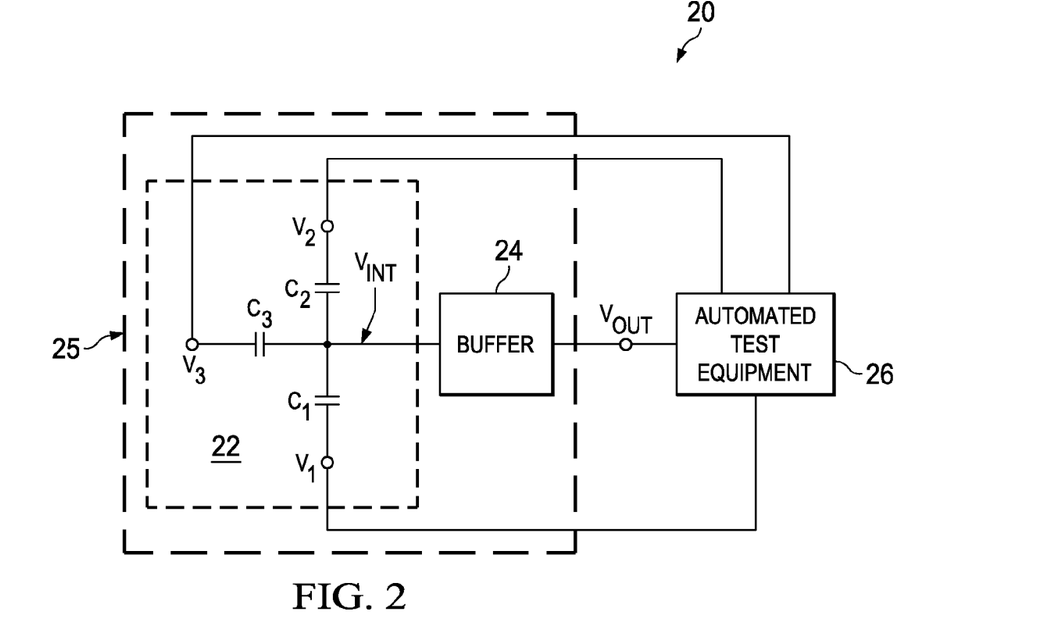
FIG. 2 illustrates a block diagram of a capacitor evaluation configuration.

FIG. 2 illustrates a block diagram of a capacitor evaluation configuration designated generally at 20. Evaluation configuration 20 includes a capacitive network 22 and buffer 24 formed as part of an integrated circuit 25, where integrated circuit 25 may represent any of various different devices and may include configuration 20 for purposes of design, testing, specification confirmation, and the like. Integrated circuit 25 is further connected in various fashions to automated test equipment 26, as may be achieved during circuit design or later at verification or operational testing. In a preferred embodiment, automated test equipment 26 may be embodied by internal circuitry within an integrated circuit (e.g., apart or including integrated circuit 25) or laboratory bench equipment similarly may interface with integrated circuit 25. Also in a preferred embodiment, capacitive network 22 includes at least three capacitors $C_1$, $C_2$, and $C_3$, each with a same nominal capacitance (although differing values could be used, given the teachings with respect to ratios and other aspects of this document). Each of these capacitors has a first terminal coupled to a mutual intermediate node $V_{INT}$, and node $V_{INT}$ is also connected as an input to buffer 24. Buffer 24 provides an output terminal, $V_{OUT}$, that is coupled to and monitored by automated test equipment 26. Automated test equipment 26 also has respective connections to the second terminal of each of capacitors $C_1$, $C_2$, and $C_3$, and for sake of reference each such second terminal is referred to herein as an input by way of receiving a respective voltage, $V_1$, $V_2$, and $V_3$, from automated test equipment 26. For example, therefore, capacitor $C_1$ has one terminal connected to $V_{INT}$ and an opposing terminal $V_1$ receiving that voltage from automated test equipment 26. Similar observations will be evident to one skilled in the art with respect to capacitor $C_2$ having an input terminal/voltage $V_2$ and capacitor $C_3$ having an input terminal/voltage $V_3$.

Lastly, note that terminals $V_1$, $V_2$, $V_3$, and $V_{OUT}$ may be realized by way of test pads for coupling to equipment 26.

Figure 3:
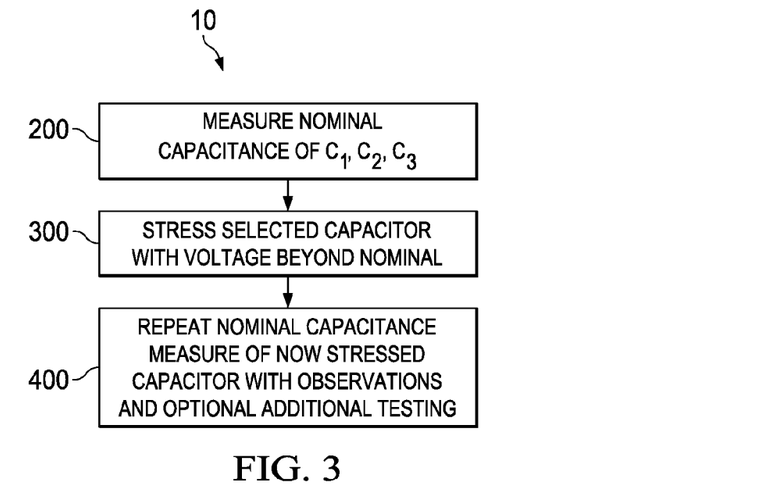
FIG. 3 illustrates a flowchart to introduce a preferred embodiment method 100 of operation of evaluation configuration 20 of FIG. 2.

FIG. 3 illustrates a flowchart to introduce a preferred embodiment method 100 of operation of evaluation configuration 20 of FIG. 2, with various other details explored throughout this document. By way of introduction, method 100 permits automated test equipment 26 to control the electrical configuration of capacitors in capacitive network 22 so as to selectively bias them in alternative manners and to test the resultant voltage and effects of the configurations and biases. More particularly, such parameters are evaluated at node $V_{INT}$, and in order to reduce effects of the testing equipment during such evaluations, node $V_{INT}$ is isolated by way of buffer 24, that is, the parameters are also comparably testable via terminal $V_{OUT}$, while reducing the effects of the testing on the voltage that appears at node $V_{INT}$.

Looking to method 100 in more detail, a first process 200 measures the nominal capacitance (relative) of each of capacitors $C_1$, $C_2$, and $C_3$ or certain types of tunnel-FETs. As detailed later in connection with FIG. 6, in one preferred embodiment process 200 is performed by pairing two of the three capacitors in capacitive network 22 at a time and measuring the capacitance of each capacitor in such a pair under a nominal voltage, and then repeating until all capacitors are at least one time measured. Next, a second process 300 applies a stress voltage, that is, a voltage in excess of the nominal voltage, to at least one capacitor in capacitive network 22. By way of example, therefore, the nominal voltage of process 200 may be a part/device/circuit specified value for which a certain percentage of yield is expected (e.g., an operational specification), while the stress voltage of process 300 is some greater percentage (e.g., one hundred percent) more than the nominal voltage; hence, the process 300 stress voltage is intended to "stress" the limits of design and operation of the stressed capacitor. Finally, method 100 concludes with a third process 400, where observations and analyses occur with respect to the voltage increase across the one stressed capacitor from process 300, including for example an additional nominal measurement of its capacitance; note that other parameters associated with the stressed capacitor from process 300 also may be evaluated. In any event, with the repeated nominal evaluation of process 400, a preferred embodiment evaluates and observes any change in parameter behavior of the stressed capacitor as compared to the comparable parameter from process 200. Any such change may evidence, or may suggest optional additional testing, to determine any failure of the stressed capacitor. As examples, the capacitance of the stressed capacitor may increase or decrease. As another example, the stressed capacitor may develop a decreased resistance through its dielectric, as manifested, for example, by way of leakage across the capacitor after it has been stressed. Additional examples and details will be further understood with reference to the remainder of this document.

Figure 4:
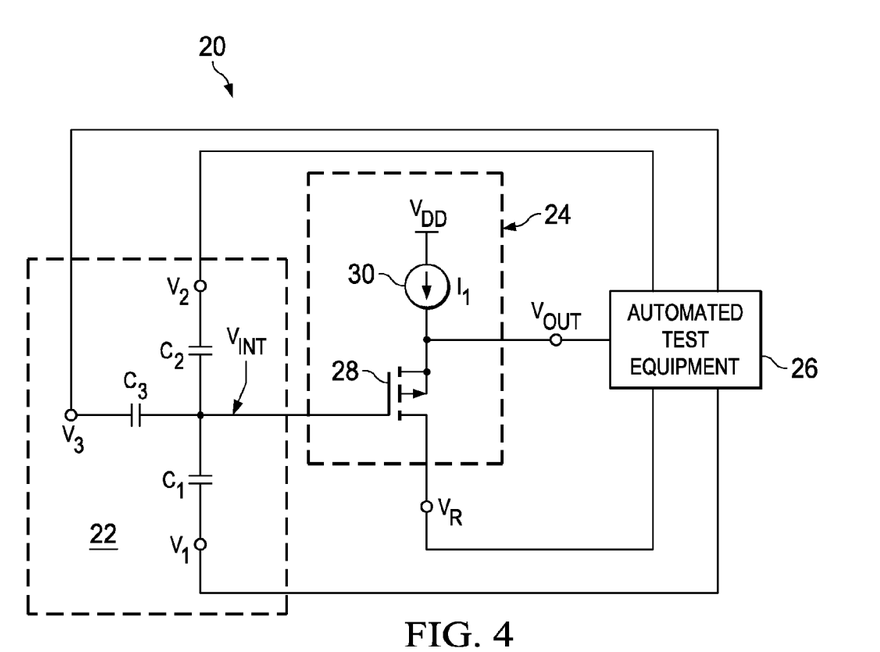
FIG. 4 illustrates a preferred embodiment for evaluation configuration 20 of FIG. 2.

FIG. 4 illustrates evaluation configuration 20 of FIG. 2, with additional schematic details for buffer 24 and by way of introduction to additional operational details provided below. In the preferred embodiment of FIG. 4, buffer 24 includes devices and connections from the above-incorporated U.S. Pat. No. 8,686,744, and the reader is referred thereto for additional details. By way of discussion in this document, the devices and connections include a p-channel MOS transistor 28, having its gate connected to intermediate node $V_{INT}$. The drain of transistor 28 is connected to a reference voltage terminal $V_R$, and the source of transistor 28 is connected to terminal $V_{OUT}$ and connected through a current source 30 to a power supply voltage $V_{DD}$. The body node of transistor 28 is connected to its source node, or alternatively to a substrate connection if desired. Current source 30 is a conventional current source device, such as a MOS transistor biased by way of a reference voltage to conduct a substantially constant current; a current mirror or other circuit for providing a substantially constant current also may be used. Lastly, while not shown in the earlier-discussed FIG. 2, FIG. 4 also provides a connection of automated test equipment 26 to buffer 24 and, more particularly, to reference terminal $V_R$, so as to facilitate the buffering effect, as further understood below.

Of course, it is contemplated that transistor 28 alternatively may be realized as an n-channel MOS transistor, in which case output terminal $V_{OUT}$ would be connected to the source of that n-channel device. These and other variations are contemplated to be evident to those skilled in the art having reference to this document.

In operation of buffer 24, transistor 28 is biased into its saturation region and operates as a source follower device by virtue of current source 30 providing a substantially constant source-drain current $I_1$. This constant source-drain current $I_1$ causes transistor 28 to have a constant gate-to-source voltage. Changes in the voltage at the gate of transistor 28, presented at intermediate node $V_{INT}$, are thus reflected directly at output terminal $V_{OUT}$. The precision with which the voltage at output terminal $V_{OUT}$ tracks the voltage at intermediate node $V_{INT}$ is better than that of the prior art approach of FIG. 1 and depends on the operation of current source 30 to provide constant current $I_1$. Accordingly, for purposes of this description, the "substantially constant" current $I_1$ to be provided by current source 30 refers to a current that is sufficiently constant to meet the desired precision of the capacitance testing and evaluation described herein.

Having described various aspects of preferred embodiments, FIGS. 5a through 5e illustrate the application of various voltages by automated test equipment 26 to capacitive network 22 of FIG. 4, although the dotted rectangle and designation of 22 are removed in these latter Figures to simplify the illustration and discussion. Moreover, FIGS. 6, 8, and 9 further elaborate on processes 100, 200, and 300, respectively, of FIG. 3, and correspond to various of the illustrations of FIGS. 5a through 5f. Each of these aspects is further explored below.

Figure 5A:
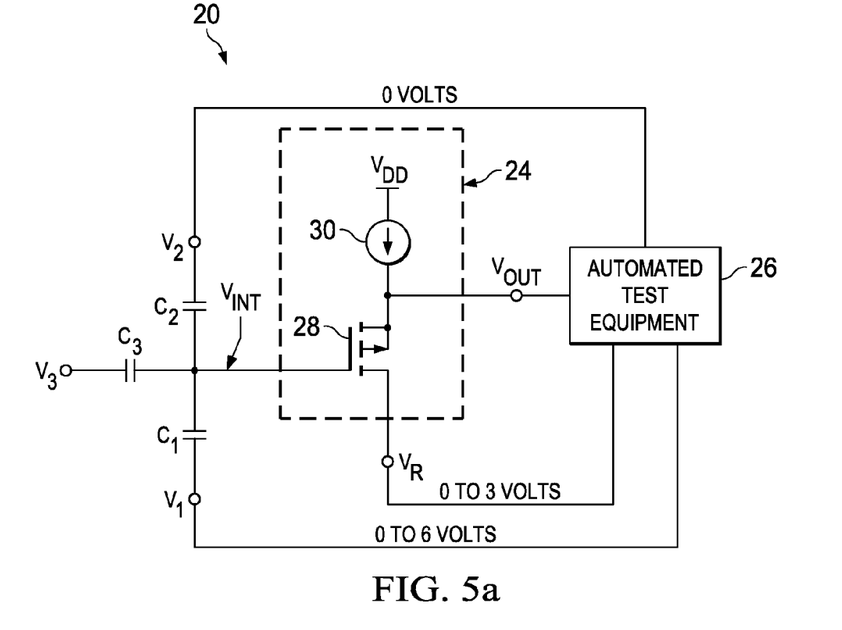
FIG. 5a illustrates the preferred embodiment of FIG. 4 where capacitors $C_1$ and $C_2$ are selected, while capacitor $C_3$ is left to float.
Figure 6:
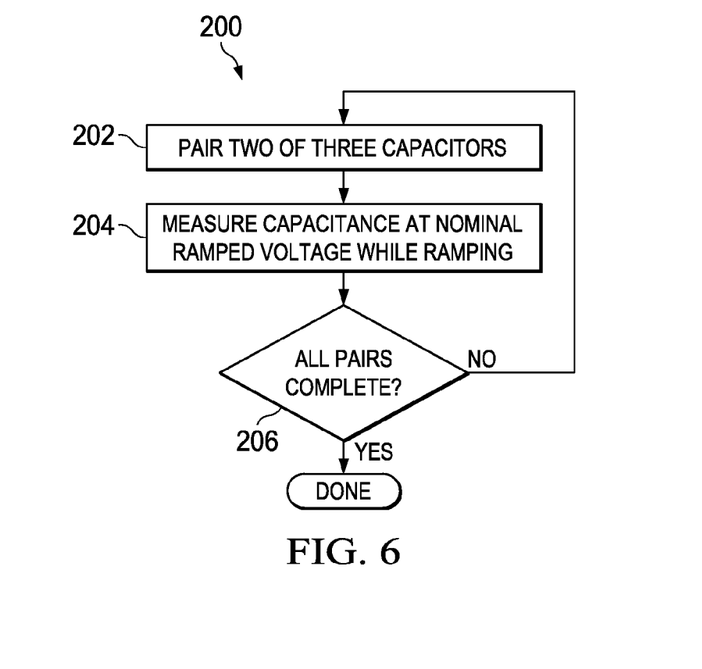
FIG. 6 illustrates process 200 from FIG. 3 in more detail.

FIG. 6 illustrates process 200 from FIG. 3 in more detail, and starts with a step 202 in which two of the three capacitors in capacitive network 22 are selected by equipment 26. This capacitor selection may be achieved by establishing the connection of FIG. 5a, where the selected capacitors in that example are $C_1$ and $C_2$—note, therefore, that capacitor $C_3$ is left to float (or, alternatively, its terminal $V_3$ could be connected to the reference voltage, $V_R$).

Next in FIG. 6, step 204 measures the capacitance of the two capacitors selected in step 202, either in absolute or relative manner, using equipment 26 and at a nominal voltage range. An example of this step is shown in FIG. 5a, and the operation associated with FIG. 5a is akin to the two-capacitor configuration and operation in U.S. Pat. No. 8,686,744. More particularly, terminal $V_2$ is biased to a reference voltage such as ground (shown in FIG. 5a as 0 volts), and power supply voltage $V_{DD}$ is applied to current source 30. Meanwhile, measurement of the relative capacitances of capacitors $C_1$ and $C_2$ is performed by automated test equipment 26 ramping the voltage applied to bias terminal $V_1$ at a selected time rate of change, beginning from a low voltage such as that applied to terminal $V_2$ and increasing to a nominal voltage, shown in FIG. 5a as 6 volts.

Simultaneously and over the same period of the ramped voltage at terminal $V_1$, automated test equipment 26 applies a ramping voltage to bias reference terminal $V_R$, also beginning from a low voltage such as ground. The time rate of change of the voltage applied to terminal $V_R$ relative to that of the voltage applied to terminal $V_1$ is selected to maintain a substantially constant drain-to-source voltage drop across transistor 28, preferably by ramping the voltage at terminal $V_R$ to equal the expected voltage increase at node $V_{INT}$, shown in step 204 as $E\{V_{INT}\}$. In this regard, assuming that capacitors $C_1$ and $C_2$ are expected to have an equal nominal capacitance, then as further shown below they should equally divide the ramping 0 to 6 volts being applied to terminal $V_1$, thereby causing the voltage at node $V_{INT}$ (i.e., across capacitor $C_2$) to ramp from 0 to 3 volts; hence, the ramping voltage at terminal $V_R$, as applied by equipment 26, is also preferably applied to ramp from 0 to 3 volts, at the same time that the voltage applied to $V_1$ ramps from 0 to 6 volts (i.e., at the same time the voltage divided to $V_{INT}$ is expected, based on the equal capacitance of $C_1$ and $C_2$, to ramp from 0 to 3 volts).

Looking at the preceding operation in additional detail, the nominal capacitor voltage divider ratio, $C_P$, presented by capacitors $C_1$ and $C_2$ is determined, preferably a priori, for example from the circuit design or as based on actual measurements of dielectric properties and feature sizes for the lot or wafer of the instance of evaluation configuration 20. The voltage divider ratio $C_P$ determines the rate the voltage at intermediate node $V_{INT}$ will ramp relative to the ramping of the applied voltage at terminal $V_1$. Particularly, and according to circuit analysis, the voltage at intermediate node $V_{INT}$ between capacitors $C_1$ and $C_2$ can be derived as shown in the following Equation 4:

$$V_{INT}(t) = \left(\frac{C_1}{C_1 + C_2}\right)[V_1(t) - V_2] \qquad \text{Equation 4}$$

where $V_1(t)$ is the time-dependent (i.e., ramping) voltage at terminal $V_1$, $V_{INT}(t)$ is the time-dependent voltage at intermediate node $V_{INT}$, and $C_1$ and $C_2$ are the nominal capacitances values of the respective capacitors. Accordingly, the capacitor voltage divider ratio $C_P$ can be readily derived from the nominal capacitances $C_1$ and $C_2$, as shown in the following Equation 5:

$$C_P = \left(\frac{C_1}{C_1 + C_2}\right) \qquad \text{Equation 5}$$

From Equation 5, therefore, when, as in the preferred embodiment, the capacitors $C_1$ and $C_2$ (or $C_3$, discussed below) have the same capacitance, then the voltage divider ratio $C_P$ is readily calculable per Equation 5, as shown in the following Equation 5.1:

$$C_P = \left(\frac{C_1}{C_1 + C_2}\right) = \left(\frac{C_2}{C_2 + C_2}\right) = \frac{C_2}{2C_2} = \frac{1}{2} \qquad \text{Equation 5.1}$$

In other words, Equation 5.1 confirms what was stated before—for equal value capacitors, the voltage divider ratio is anticipated to be one half, that is, for a ramping voltage range applied across the series connection of those capacitors, the voltage divided to the intermediate node, $V_{INT}$, between them, should be one half of the range.

Further, recall that the reference voltage applied to terminal $V_R$ (by equipment 26) is selected to match, in value and time, that which is expected to occur at $V_{INT}$. In other words, therefore, once the time rate of change (i.e., slope) of the voltage to be applied to terminal $V_1$ is selected or otherwise identified, the time rate of change (i.e., slope) of the voltage to be applied to terminal $V_R$ is then determined as the product of voltage divider ratio $C_P$ and the slope of the voltage ramp at terminal $V_1$.

Figure 7:
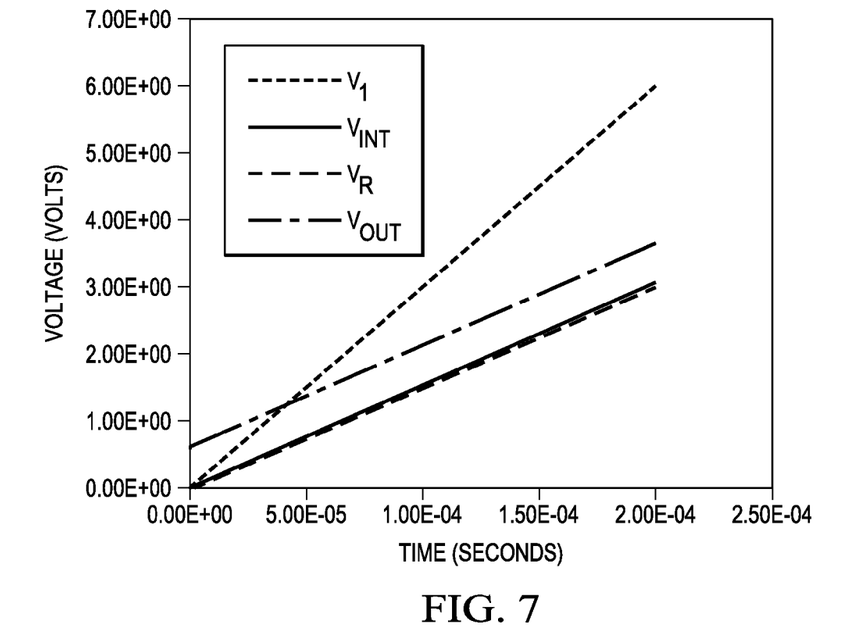

The effects of the above aspects are further explored in connection with the example of FIG. 5a and the plot illustrated in FIG. 7, where the latter shows time across its horizontal axis and voltage across its vertical axis. As described above, the voltage divider ratio $C_P$ corresponds to the fraction of the voltage at terminal $V_1$ that appears at intermediate node $V_{INT}$. Accordingly, if the slope over time of the voltage at terminal $V_1$ is S, then the slope of the voltage at intermediate terminal $V_{INT}$ will correspond to the product of the voltage divider ratio $C_P$ and the slope S. And, in the preferred embodiment example $C_P=\frac{1}{2}$ (see Equation 5.1). Hence, the voltage expected at $V_{INT}$ will be $\frac{1}{2}(V_1)$, and also as mentioned above, this voltage is therefore applied to terminal $V_R$. Confirming, therefore, the voltage at reference terminal $V_R$ is ramped by automated test equipment 26 at the same rate of change as expected of the voltage at terminal $V_{INT}$. In the example of FIG. 5a, therefore, the capacitor input voltage applied by equipment 26 to terminal $V_1$ ramps over a period of time from 0 to 6 volts, and over that same period the voltage applied by equipment 26 to reference terminal $V_R$ ramps from 0 to 3 volts. Both of these signals are also shown in the plot of FIG. 7.

As described above, transistor 28 operates as a source follower, given that a constant source-drain current is being supplied by current source 30. With transistor 28 in its saturation region, which occurs upon application of a sufficiently high supply voltage $V_{DD}$, the gate-to-source voltage of transistor 28 will remain constant. As the voltage at intermediate node $V_{INT}$ increases over time as the voltage at terminal $V_1$ is ramped, so too will the output voltage at terminal $V_{OUT}$. And because the voltage at terminal $V_R$ at the drain of transistor 28 is ramping at the same rate as the (expected) voltage at intermediate node $V_{INT}$, the drain-to-source voltage of transistor 28 will remain constant. Thus, the voltages at terminals $V_1$ and $V_R$ are simultaneously ramped by equipment 26, during which time the voltage at terminal $V_{OUT}$ is measured. Hence, ramping of the applied voltage at terminal $V_R$ simultaneously with the voltage at terminal $V_1$, the former at the reduced slope relative to the latter corresponding to voltage divider ratio $C_P$, causes the drain-to-source voltage of transistor 28 to remain substantially constant, even as the source voltage (at terminal $V_{OUT}$) rises with the rising voltage at intermediate node $V_{INT}$. By maintaining both the drain-to-source voltage and the gate-to-source voltage constant, the parasitic capacitances presented by transistor 28 to intermediate node $V_{INT}$ remain constant over the applied voltage range, thereby accomplishing the intended isolating or buffering effect of buffer 24. In other words, the resulting source voltage at terminal $V_{OUT}$, as also shown in the plot of FIG. 7, is thus not non-linearly affected by the charging and discharging of these device parasitic capacitance. In addition, shifting of the threshold voltage of transistor 28 due to drain effects is greatly reduced. Consequently, the following measurement of capacitive match (or mismatch) is thus more precise as compared to other techniques.

The slope of time-dependent voltage $V_{OUT}(t)$ in response to the ramped voltage at terminal $V_1$ is used by equipment 26 to determine the relative capacitances of $C_1$ and $C_2$ as shown in the following Equation 6:

$$\left(\frac{C_2}{C_1}\right) = \frac{(1-S)}{S} \quad \text{Equation 6}$$

Specifically, in operation, automated test equipment 26 (or other alternative circuitry or methodology) determines the slope S of the measured output voltage $V_{OUT}(t)$, and from that slope S equipment 26 solves for the relative ratio of capacitances $C_2/C_1$. To the extent that this ratio deviates from that expected based on the nominal capacitances $C_1$ and $C_2$, that deviation will correspond to the capacitive mismatch between capacitors $C_1$ and $C_2$. For example, in the present embodiment where $C_1=C_2$, then the expected slope would be is readily calculable per Equation 6, as shown in the following Equation 6.1:

$$\left(\frac{C_2}{C_2}\right) = 1 = \frac{1-S}{(S)};$$

$$(1-S) = S;$$

$$S = \frac{1}{2}$$

Equation 6.1

From Equation 6.1, therefore, when $C_1=C_2$, then the expected slope S of the output voltage $V_{OUT}(t)$ would be ½, and to the extent that the measured slope differs from ½, there is thusly detected a capacitive mismatch between capacitors $C_1$ and $C_2$ (i.e., with respect to capacitance, $C_1 \neq C_2$).

Figure 5B:
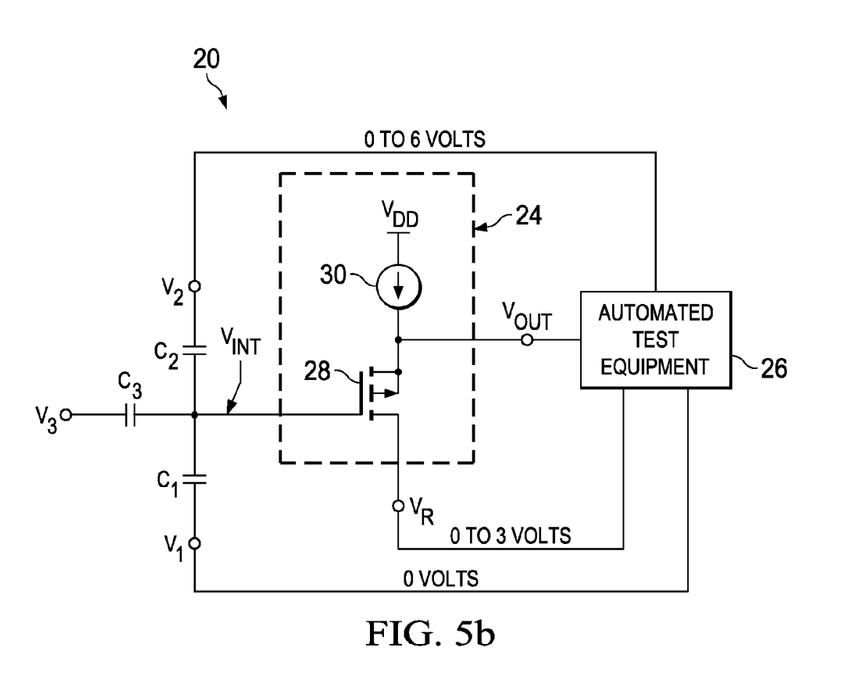
FIG. 5b illustrates the preferred embodiment of FIG. 5a, but where the capacitor input voltages are reversed for terminals $V_1$ and $V_2$.

FIG. 5b illustrates an additional or alternative nominal measurement, where the capacitor input voltages are reversed for terminals $V_1$ and $V_2$, that is, equipment 26 applies 0 volts to terminal $V_1$ and the ramping voltage of 0 to 6 volts to terminal $V_2$. One skilled in the art will readily appreciate that the aspects described above will again apply to FIG. 5b, with $V_{INT}$ here representing (relative to ground) the voltage across $C_1$. If the configuration of FIG. 5b is conducted in addition to that of FIG. 5a, then the final value at $V_{OUT}$ should be the same for both configurations, thereby confirming that $C_1=C_2$; of course, if the values of $V_{OUT}$ differ for each, there is a mismatch between those capacitance values, as again may be determined from the slope of $V_{OUT}$ for either configuration.

Figure 5C:
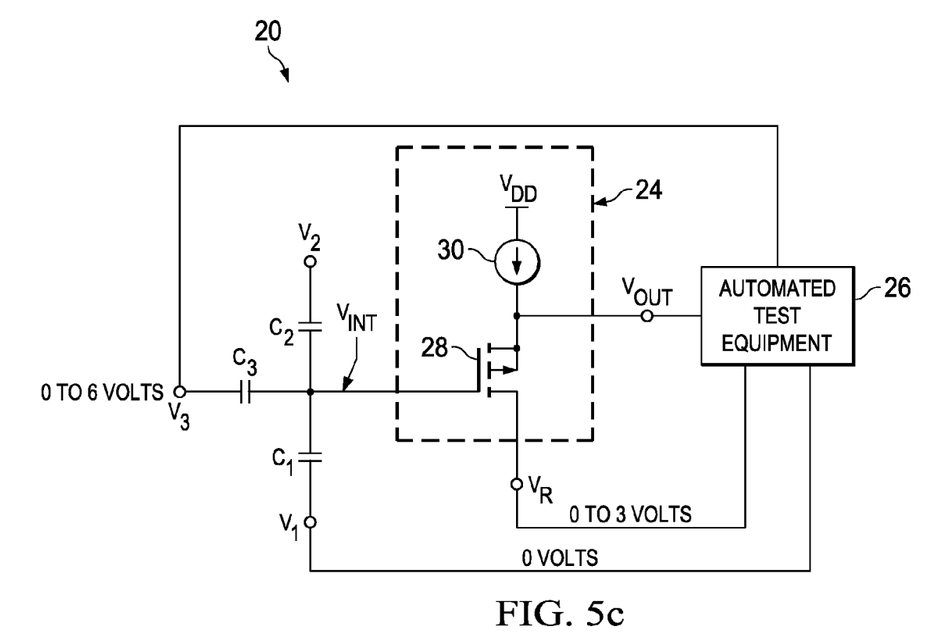
FIG. 5c illustrates the preferred embodiment of FIG. 4 where capacitors $C_1$ and $C_3$ are selected, while capacitor $C_2$ is left to float.

Returning to FIG. 7 and having extensively detailed its step 204 in connection with the illustration of FIGS. 5a (and 5b), following step 204, a step 206 may cause additional iterations to be made, preferably for all different pairings of potential capacitors in capacitive network 22. For example, with FIGS. 5a (and 5b) having paired capacitors $C_1$ and $C_2$, step 206 will determine that not all capacitors in the network (e.g., having three capacitors) have been paired, in which case method 200 repeats steps 202 and 204, with respect to another pair of capacitors. In this regard, FIG. 5c illustrates the pairing by equipment 26 of capacitors $C_1$ and $C_3$, with capacitor $C_2$ floating. Again, therefore, one capacitor (e.g., $C_1$) receives a fixed terminal voltage while during a period of time the other in the pair (e.g., $C_3$) receives a ramped voltage, while during the same period reference $V_R$ is ramped at $E\{V_{INT}\}$. Moreover, equipment 26 monitors $V_{OUT}(t)$ during this time and determines its slope S, from which a determination is made whether that slope represents the expected relative ratio of capacitances $C_3/C_1$. To the extent, if any, that this ratio deviates from that expected based on the nominal capacitances $C_1$ and $C_3$, that deviation will correspond to the capacitive mismatch between capacitors $C_1$ and $C_3$. Lastly, of course, the above also may be repeated with respect to capacitors $C_2$ and $C_3$.

Completing FIG. 6, once each pair of capacitors in network 22 have been evaluated as described above, step 206 determines that no other capacitors require such evaluation, and process 200 completes. Recall then from FIG. 2, once process 200 completes, a next process 300 is undertaken, as further discussed below.

Figure 5D:
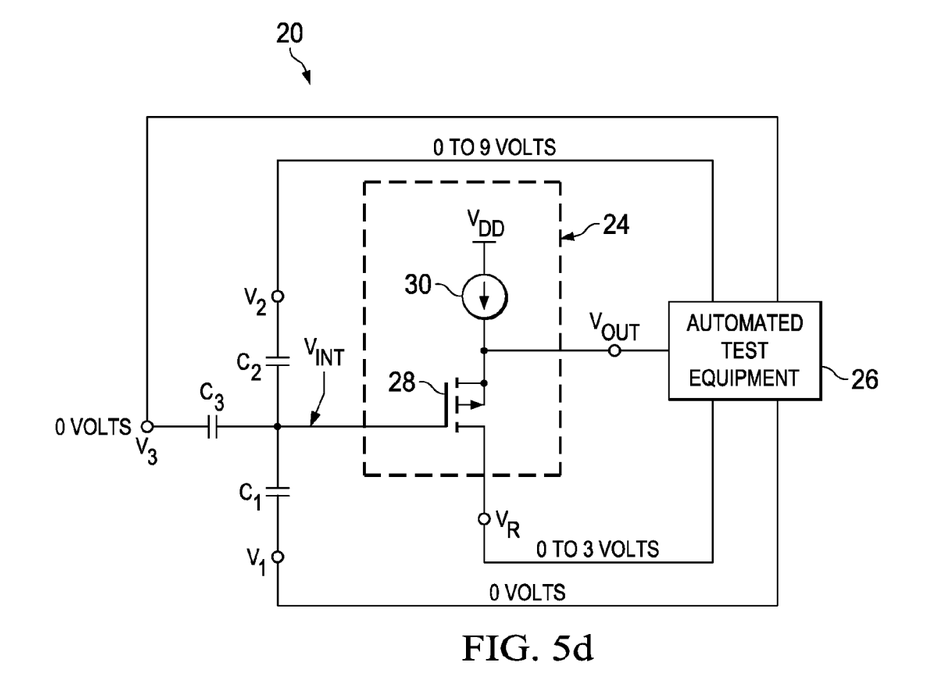
FIG. 5d illustrates the preferred embodiment of FIG. 4 where capacitor $C_2$ is to be stress tested.
Figure 8:
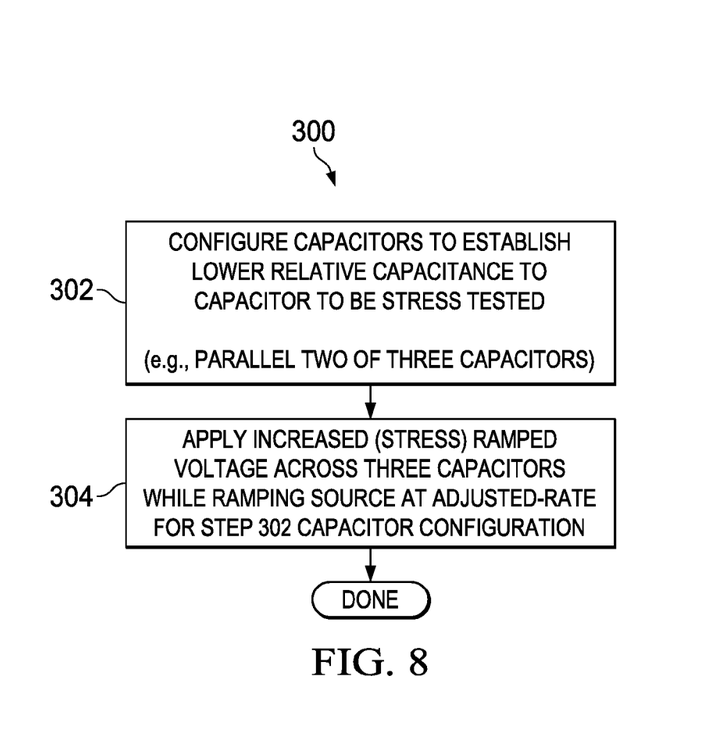
FIG. 8 illustrates process 300 from FIG. 3 in more detail.

FIG. 8 illustrates additional steps in connection with the capacitor stress process 300 of FIG. 2, and the discussion is further explored in connection with FIG. 5d. In step 302, equipment 26 configures capacitors in network 22 so that a capacitor to be stress tested has a lesser amount of capacitance than the combined (or equivalent) capacitance of other capacitors that will be included in the stress testing. For example, in FIG. 5d, assume capacitor $C_2$ is to be stress tested; accordingly, step 302 configures two other capacitors in network 22, which in the present example includes only two other capacitors $C_1$ and $C_3$, so that the capacitance of these two configured capacitors collectively exceeds the to-be stressed capacitor, $C_2$. In a preferred embodiment, this relative capacitance is achieved by connecting the configured capacitors $C_1$ and $C_3$ in parallel, which is electrically achieved by connecting a same potential to their respective terminals $V_1$ and $V_3$; thus, in FIG. 5d, a common voltage of 0 volts is shown connected by equipment 26 to terminals $V_1$ and $V_3$. Also in this regard, equipment 26 may include switching circuitry (not expressly shown) so as to connect terminals $V_1$ and $V_3$ directly to one another, while applying a common voltage to that connection, or each terminal may individually receive the mutual voltage level.

Next in process 300, step 304 applies a ramped voltage level across capacitors, including the to-be stressed capacitor, where the voltage range is selected to nominally bias the stressed capacitor beyond its nominal value. In the present example, capacitor $C_2$ was nominally biased to 3 volts described above; thus, in the preferred embodiment and for purposes of stressing that capacitor, step 304 causes a bias greater than 3 volts. In one embodiment, the increased bias is achieved by virtue of the change in capacitance by configuring $C_1$ and $C_3$ as a parallel capacitance in series with $C_2$, that is, $C_2$ will necessarily drop additional voltage in this changed configuration. Moreover, the stressed voltage can be further increased by increasing the ramping voltage applied to $V_2$ (e.g., greater than that used in step 204 of process 200). For example, therefore, recall in FIG. 5a that a nominal voltage range of 0 to 6 volts was applied to terminal $V_1$ of capacitor $C_2$, thereby giving rise to a nominal bias across it of 3 volts. In contrast, in FIG. 5d an increased (i.e., stressing) voltage range of 0 to 9 volts is applied to terminal $V_2$ of capacitor $C_2$, which as discussed below will drop approximately 6 volts across capacitor $C_2$, so as to place it in a stressed condition.

Figure 5E:
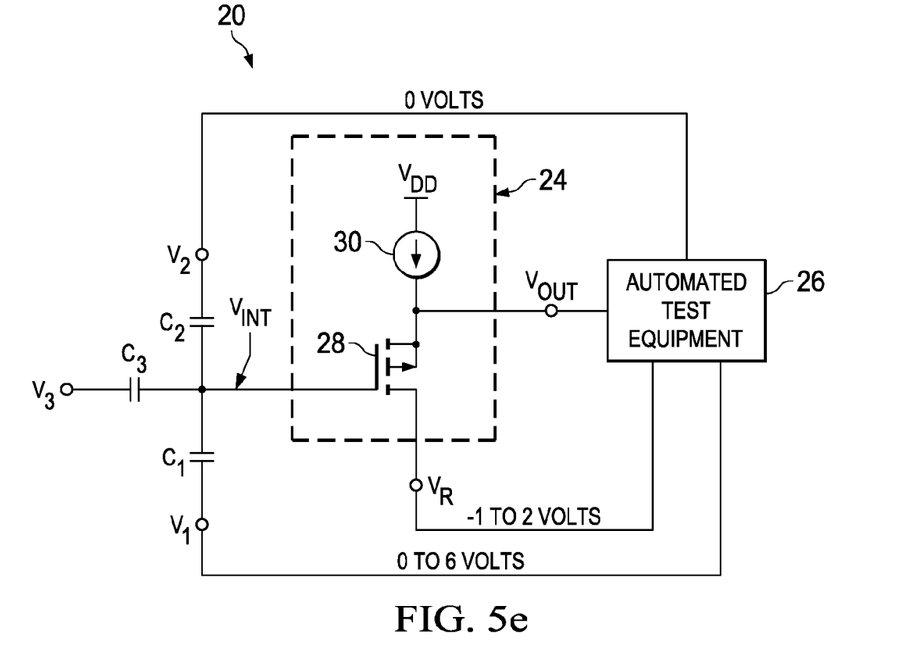
FIG. 5e illustrates the preferred embodiment of FIG. 4 where the post-stressed capacitor $C_2$ is re-evaluated at nominal levels.

Step 304, consistent in part with the preceding discussion of buffer 24, also applies a second ramped voltage to terminal $V_R$; however, step 304 differs from the earlier step 204 by taking into account that the configuration of FIG. 5e no longer has solely two equal capacitors in series. More specifically, from FIG. 5d, recall that the resultant capacitive network is $C_2$ connected in series with the parallel connection of $C_1$ and $C_3$. Thus, a voltage divider is thereby created and, as known in the art, the voltage drop across a series capacitance in the divider is inversely proportional to the total capacitance value of the divider. As a result, the voltage ramp of node $V_{INT}$ (i.e., the voltage across capacitor $C_1$ (and the parallel $C_3$) is as shown in the following Equation 7:

$$V_{INT}(t) = \left(\frac{(C_2)}{(C_1 + C_3) + C_2}\right)[V_2(t) - V_1] \quad \text{Equation 7}$$

Moreover, because in the present example all three capacitance values are nominally equal (and were confirmed as such in process 200), then the expected voltage $V_{INT}$ will rise to 3.0 volts, once the voltage to terminal $V_2$ reaches its maximum of 9.0 volts, as shown in the following Equation 7.1:

$$V_{INT}(t) = \left(\frac{C_2}{(C_2 + C_2) + C_2}\right)[9 - 0] = \frac{1}{3}(9) = 3 \quad \text{Equation 7.1}$$

With the expectation, therefore, that $V_{INT}$ will ramp from 0 to 3 volts during the same period that $V_2$ ramps from 0 to 9 volts, then in the preferred embodiment equipment 26 likewise ramps the reference voltage $V_R$ from 0 to 3 volts (i.e., to $E\{V_{INT}\}$). Of course, if the earlier steps determine a mismatch in any of capacitors $C_1$, $C_2$, and $C_3$, then adjustments can be made, given the teachings herein, to adjust the ramping of $V_R$ accordingly.

Continuing with the example of FIG. 5d, if the biasing of terminals $V_2$ and $V_R$ cause node $V_{INT}$ to ramp from 0 to 3 volts, then the remainder of the voltage across the divider, that is, the voltage across the stressed capacitor $C_2$, will ramp to a total of 6 volts. Thus, whereas during nominal measurement process 200 capacitor $C_2$ dropped 3.0 volts, stress process 300 (and step 304 thereof) doubles that drop voltage to 6.0 volts, thereby stressing the capacitor to twice its nominal bias. While the example demonstrates a stress of a 100% increase in bias, other values, greater than the nominal bias value, could be implemented.

Figure 9:
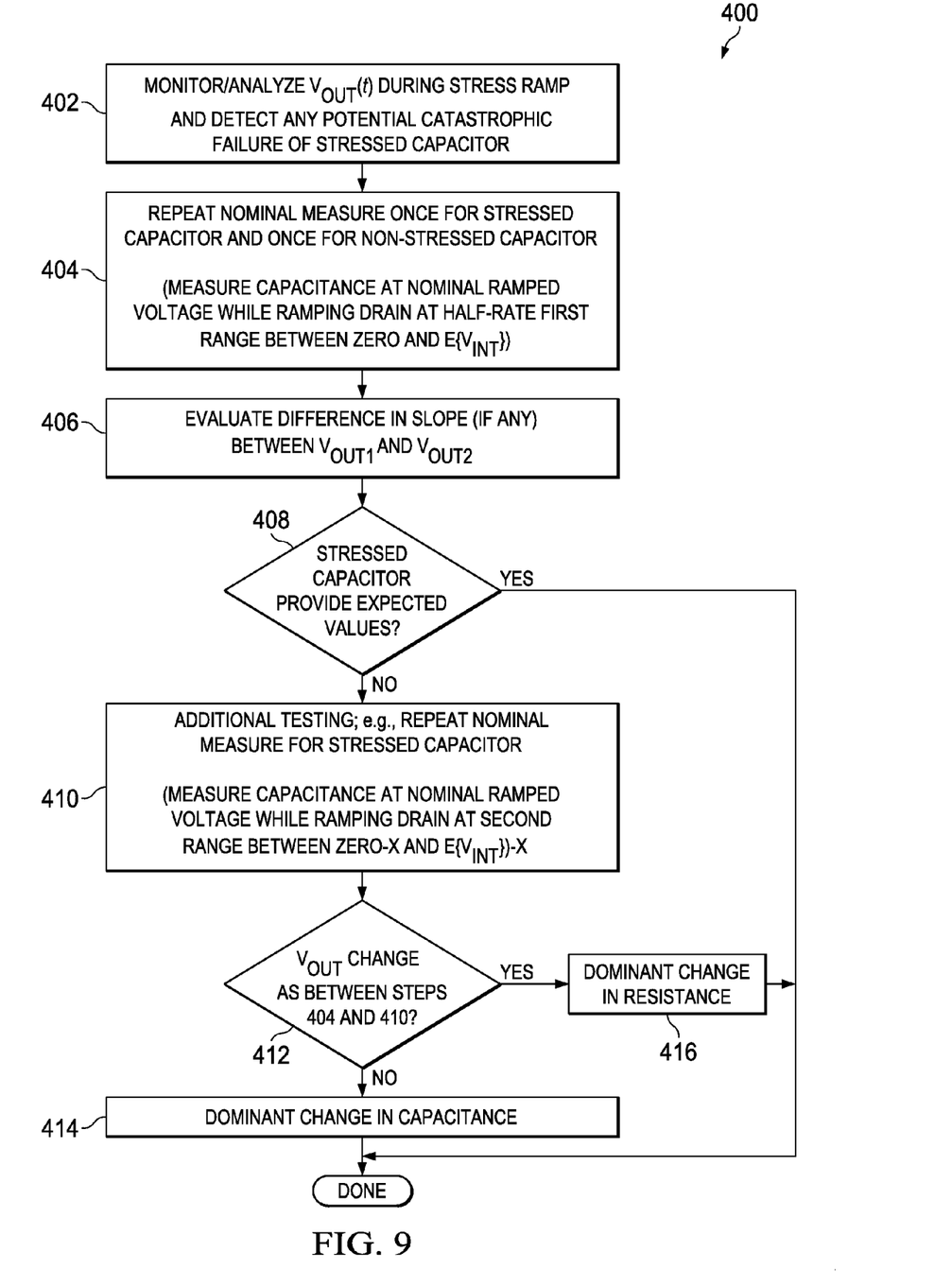
FIG. 9 illustrates process 400 from FIG. 3 in more detail.

FIG. 9 illustrates additional steps in connection with the observation and analyses of process 400 of FIG. 2, and the discussion is further explored in connection with the configuration of FIG. 5e and the plots of FIGS. 10 through 13.

Figure 10:
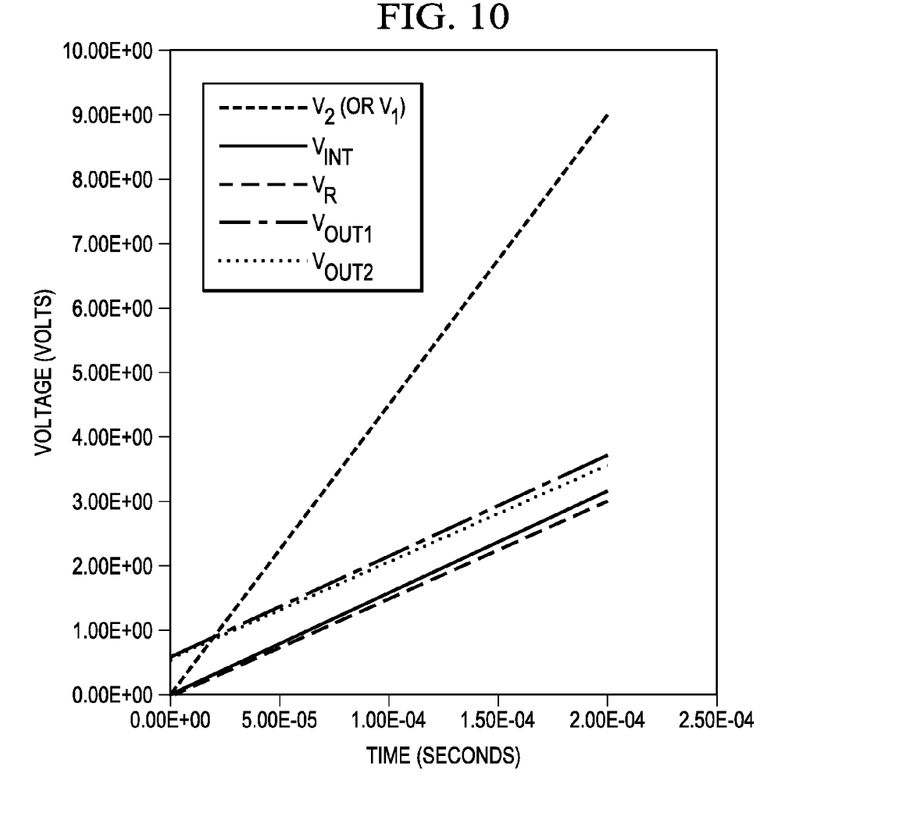
FIG. 10 illustrates a plot of example signals from the configuration of FIG. 5d.
Figure 11:
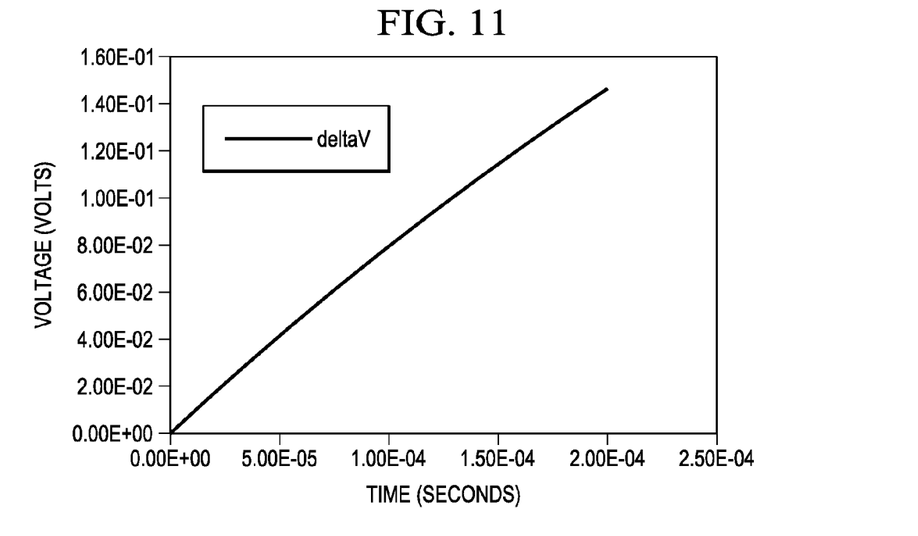
FIG. 11 illustrates the delta of the FIG. 10 slopes of $V_{OUT1}$ and $V_{OUT2}$.

In step 402, equipment 26 monitors $V_{OUT}(t)$ as the ramped capacitor input voltage is applied (e.g., to terminal $V_2$) and the ramped reference voltage is applied to terminal $V_R$. In general, and without any catastrophic failure of the post-stressed capacitor (e.g., $C_2$), the signals will take the form shown in FIG. 10, which like FIG. 7, above, shows time across its horizontal axis and voltage across its vertical axis. FIG. 10, therefore, confirms various aspects of the discussion above. For example, during a same time period, $V_2$ ramps from 0 to 9 volts, while both $V_R$ and $V_{INT}$ ramp from 0 to approximately 3 volts. Moreover, because both the gate-to-source and source-to-drain potentials are held relatively constant due to the ramp at $V_R$ tracking the ramp at $V_{INT}$, then $V_{OUT}$ has approximately the same slope as $V_{INT}$ (and $V_R$), but is higher by approximately 0.5 volts due to the threshold voltage of transistor 28. In all events, note that any significant departure, either in slope or amplitude, from the expected $V_{OUT}$ of FIG. 10 could indicate a catastrophic failure of the stressed capacitor.

In step 404, equipment 26 repeats the nominal measure discussed earlier in connection with step 204 of FIG. 6, but the step 404 action is taken with respect to the now post-stressed capacitor, that is, the capacitor that was stressed by process 300 (and step 304 thereof). Thus, the reader is referred to the earlier discussion as well as the illustration of FIG. 5a. In a preferred embodiment, however, the nominal measure is taken twice, applying the nominal capacitor input voltage (e.g., 0 to 6 volts) in a first instance to the stressed capacitor (to $C_2$, by way of terminal $V_2$, as shown in FIG. 5a) to produce a corresponding output indicated herein as $V_{OUT1}$, and in a second instance by applying it to the non-stressed capacitor (e.g., to $C_1$, by way of terminal $V_1$) to produce a corresponding output indicated herein as $V_{OUT2}$. Both $V_{OUT1}$ for the resultant voltage across the non-stressed capacitor and $V_{OUT2}$ for the resultant voltage across the post-stressed capacitor are shown by way of example in the plot of FIG. 10.

In step 406, equipment 26 compares the slope of $V_{OUT1}$ and $V_{OUT2}$, as may be appreciated again by way of the example plot in FIG. 10. One skilled in the art should appreciate, therefore, that if the post-stressed capacitor has had a change in its operational parameters due to the stress process 300, its slope should differ from that measured in the earlier nominal process 200; moreover, assuming that the post-stressed and non-stressed capacitors originally had the same capacitance prior to the stress process 300, then the slopes of $V_{OUT1}$ and $V_{OUT2}$ should be substantially the same if no change occurred in the post-stressed capacitor. In the plot of FIG. 10, however, the slopes of $V_{OUT1}$ and $V_{OUT2}$ diverge, particularly as the input voltage ($V_2$ or $V_1$) increases. This difference, or delta, is evaluated by equipment 26, as shown by the example plot in FIG. 11. The greater the delta, therefore, indicates the greater the change in the post-stressed capacitor, as resulting from the stress process 300.

In step 408, equipment 26 determines if the post-stressed capacitor parameters evaluated in any of steps 402 through 406 fall within expected ranges. Such ranges may be established by one skilled in the art, given various considerations including the parameter(s) tested, design specification, process variation, capacitor sizing and type, and the like. For example, equipment 26 may compare the delta of FIG. 11 to some threshold, whereby a delta below the threshold indicates no or little device failure, while a delta above the threshold indicates a failure, such as an increase or decrease in capacitance value as a result of the stress, or the formation of leakage resistance in the capacitor. Other parameters likewise may be considered. If all parameters are within expectation, method 400 may complete.

If, in step 408, one or more parameters are outside of expectation (e.g., beyond a threshold), method 400 may continue to a step 410, for additional testing. In one preferred embodiment, an additional such test repeats the nominal measure for the post-stressed capacitor (e.g., with the terminal for the post-stressed capacitor (e.g., $V_2$) set to 0 volts and the terminal of the non stressed capacitor (e.g., $V_1$) ramping from 0 to 6 volts), so as to evaluate the voltage dropped across the post-stressed capacitor. Step 410, however, further changes the ramping reference voltage $V_R$ to a lesser value than used in step 404, where the reduction may be in an amount X, as shown in step 410. Thus, where step 404 applies to terminal $V_R$ a range starting from 0 volts up to $E\{V_{INT}\}$, step 410 applies $V_R$ in a range starting from 0-X volts up to $E\{V_{INT}\}$-X; as a result, the highest voltage applied to terminal $V_R$ in the step 410 repeated nominal measure should be less (i.e., X less) than the expected value that intermediate node $V_{INT}$ will reach. By way of example, FIG. 5e illustrates this step, where X=1, so instead of equipment 26 ramping $V_R$ from 0 to 3 volts as described above, in FIG. 5e it ramps terminal $V_R$ from -1 to 2 volts.

The basis for applying this lower ramping reference voltage $V_R$ will be further explored below.

In step 412, equipment 26 determines whether $V_{OUT}$ changes, or changes beyond some threshold, as between the step 404 nominal measure using $V_R = E\{V_{INT}\}$ and the step 410 nominal measure using $V_R = E\{V_{INT}\} - X$. If such a change in $V_{OUT}$ does not occur, method 400 continues to step 414, which concludes that the change in $V_{OUT}$ slope of the post-stressed capacitor (detected in step 408), as compared to its value prior to stress, is primarily a change that has occurred in capacitance of the stressed capacitor. In contrast, if such a change in $V_{OUT}$ does occur, method 400 continues to step 416, which concludes that the change in $V_{OUT}$ slope of the post-stressed capacitor as compared to its value prior to stress, is primarily a change that has occurred in resistance of the stressed capacitor. The basis for the alternative determinations of steps 414 and 416 are further explored below.

Figure 12:
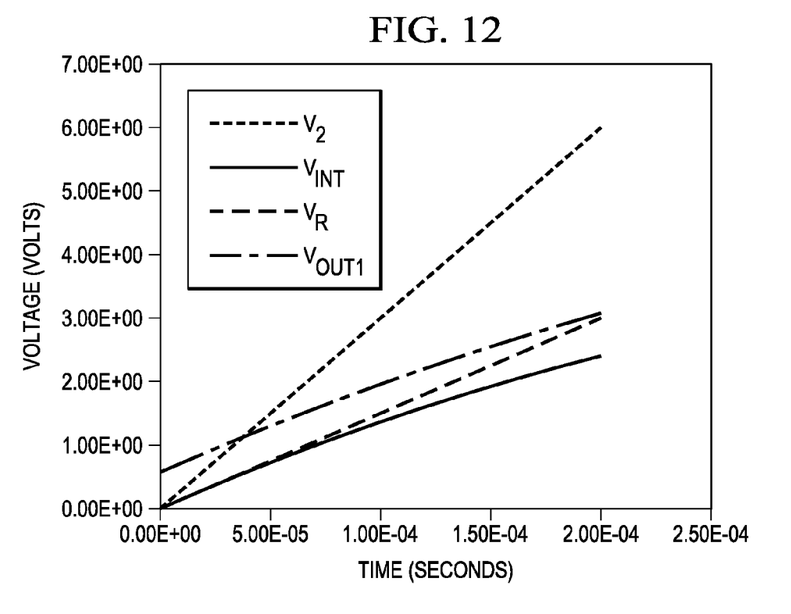
FIGS. 12 and 13 illustrate plots of various voltage signals for what might be expected from resistive changes in a stressed capacitor.
Figure 13:
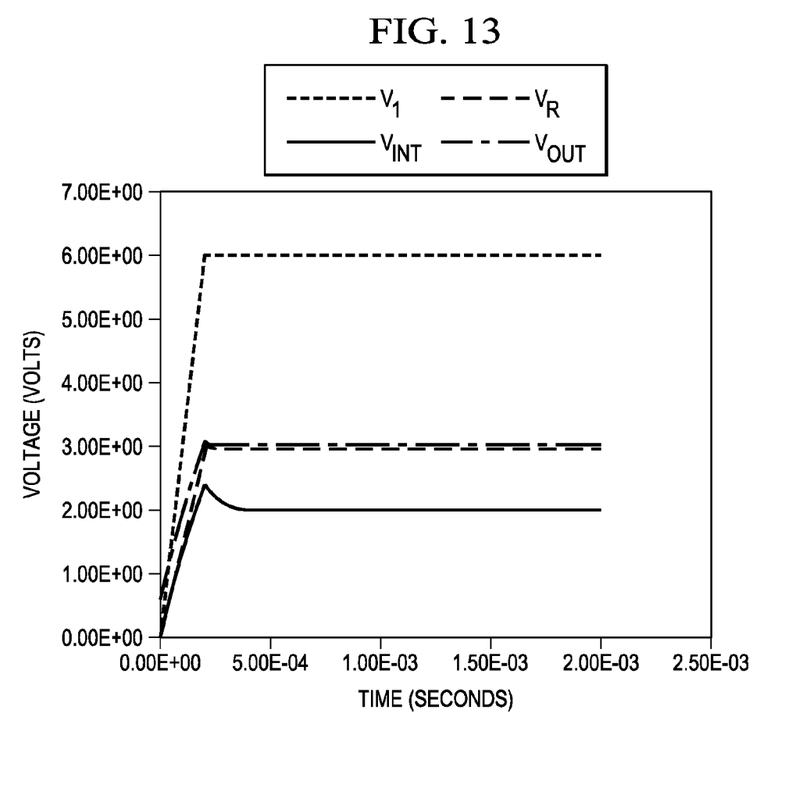

The conclusions presented in steps 414 and 416 are understood with reference to an additional discussion of FIG. 5e, given the values of $V_1(t)$ and $V_R$ in that Figure. Specifically, as $V_1$ and $V_R$ both ramp upward, if the post-stressed capacitor $C_2$ is relatively unaffected by the stress process 300, then the expectation is that as $V_1$ reaches its top 6 volts, 3 volts are dropped across $C_2$, so $V_{INT}$ will be at approximately 3 volts and $V_{OUT}$ will therefore be at least 3 volts, if not up to one threshold voltage (e.g., in this example 0.5 volts) higher than the voltage dropped across $C_2$. However, if stress process 300 causes a sufficient resistive leak to be formed in capacitor $C_2$ (e.g., tunnel resistance), then once $V_1$ reaches its top 6 volts, the resistive leak through capacitor $C_2$ provides a leakage path to ground, so $V_{INT}$ will drop from 3 volts, and $V_{OUT}$ will drop correspondingly. In this case, however, because transistor 28 is in saturation mode, then $V_{OUT}$ cannot fall below the top voltage of $V_R$, namely, 2 volts in the present example. In any event, therefore, note that with the leakage resistance, the value of $V_{OUT}$ will, over time, drop toward the upper value of $V_R$; in other words, a change in $V_{OUT}$ of this level, as detected by step 412 which compares $V_{OUT}$ of steps 402 and 410, causes method 400 to continue to step 416, concluding that the dominant change in the stressed capacitor is due to a resistance change. Indeed, FIGS. 12 and 13 illustrate a plot of the various voltage signals for what might be expected from resistive changes in a stressed capacitor, as indicated by the nominal test from step 404 of that circuit, where the time illustrated (or the duration of the imposed stress) is shorter in FIG. 12 than in FIG. 13. In FIG. 12, therefore, note that $V_{INT}$ fails to rise to the expected level of 3.0 volts, which in FIG. 13 is further shown as a brief rise to approximately 2.5 volts followed by a drop-off to 2.0 volts. Note that this failure of $V_{INT}$ to rise to 3.0 volts is further reflected, and observable, in the fact that $V_{OUT}$ fails to rise to the expected value of approximately 3.5 volts. Thus, the additional testing per step 410 and analyses of steps 412 and 416 may identify this drop in $V_{INT}$, as evident from the low value of $V_{OUT}$, as a post-stress resistive change in the capacitor. On the other hand, if step 412 determines the $V_{OUT}$ of steps 402 and 410 are comparable to one another, such as within a threshold voltage of transistor 28 difference, then method 400 continues to step 414 to conclude the dominant change in the stressed capacitor is due to a capacitance change.

From the above, various embodiments provide numerous improvements to integrated circuit capacitor testing and measurement. Various aspects have been described, and still others will be ascertainable by one skilled in the art from the present teachings. Still further, while various alternatives have been provided according to the disclosed embodiments, still others are contemplated; for example, the preferred embodiments may be applied to analyze various capacitor types, such as metal or junction or gate capacitors, although one skilled in the art may consider additional practical factors in determining the efficacy of the preferred embodiment for certain capacitors (they may not be well matched or they may have voltage variances that make the analysis either unrealistic or less useful). The preferred embodiments also may be used in a comparative sense, that is, for comparing capacitors against each other. Moreover, still others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A method of evaluating at least one parameter of a first capacitor, comprising:
   coupling a number of capacitors in a capacitor network to a common node, the number of capacitors comprising at least three capacitors;
   first,
      applying a first voltage range to the capacitor network for causing a first voltage drop across the first capacitor; and
      evaluating the at least one parameter in response to the first voltage range;
   second,
      applying a second voltage range to the capacitor network for causing a second voltage drop across the first capacitor, the second voltage drop greater than the first voltage drop; and
      evaluating the at least one parameter in response to the second voltage range; and
   third,
      re-applying the first voltage range to the capacitor network; and
      evaluating the at least one parameter in response to the re-applied first voltage range.

2. The method of claim 1 wherein the capacitor network comprises the first capacitor and a second capacitor and a third capacitor, and further comprising configuring the capacitor network for the first capacitor to be in series with one of the second capacitor or the third capacitor for the step of applying a first voltage range.

3. The method of claim 2 wherein the step of the step of applying a second voltage range comprises configuring the capacitor network for the first capacitor to be in series with a parallel combination of the second capacitor and the third capacitor.

4. The method of claim 1 and further comprising coupling an input of a buffer to the common node and the buffer having an output, wherein each of the evaluating steps is in response to a voltage at the output.

5. The method of claim 4 wherein the buffer comprises a transistor in a source follower configuration, and further comprising, while applying the first voltage range, applying a first reference voltage range to a drain of the transistor, wherein the first reference range approximates an expected voltage increase at the common node.

6. The method of claim 5 and further comprising, while applying the second voltage range, applying a second reference voltage range to a drain of the transistor, wherein the second reference range approximates an expected voltage increase at the common node.

7. The method of claim 6 and further comprising:
third, while applying a third reference voltage range to a drain of the transistor, the third reference voltage range reduced relative to the second reference voltage range, re-applying the second voltage range to the capacitor network for causing the second voltage drop across the first capacitor; and
evaluating the at least one parameter in response to the re-applied second voltage range.

8. The method of claim 7 wherein the evaluating step is operable to detect a change in capacitance in the first capacitor in response to the re-applying step.

9. The method of claim 7 wherein the evaluating step is operable to detect a change in resistive leakage in the first capacitor in response to the re-applying step.

10. The method of claim 1 wherein the second voltage range is greater than the first voltage range.

11. The method of claim 1 wherein the number of capacitors are selected from a set consisting of metal capacitors, junction capacitors, or gate capacitors.

12. A circuit for evaluating at least one parameter of a first capacitor, comprising:
a number of capacitors in a capacitor network coupled to a common node, the number of capacitors comprising at least three capacitors;
circuitry for applying a first voltage range to the capacitor network for causing a first voltage drop across the first capacitor; and
circuitry for evaluating the at least one parameter in response to the first voltage range;
circuitry for applying a second voltage range to the capacitor network, after applying the first voltage, for causing a second voltage drop across the first capacitor, the second voltage drop greater than the first voltage drop;
circuitry for evaluating the at least one parameter in response to the second voltage range and
a buffer connected to the common node and the buffer having an output, wherein the circuitry for evaluating the at least one parameter in response to the first voltage range and the second voltage range is responsive to a voltage at an output of the buffer.

13. The circuit of claim 12 wherein the capacitor network comprises the first capacitor and a second capacitor and a third capacitor, and further comprising circuitry for configuring the capacitor network for the first capacitor to be in series with one of the second capacitor or the third capacitor for the step of applying a first voltage range.

14. The method of claim 13 wherein the circuitry for applying a second voltage range comprises circuitry for configuring the capacitor network for the first capacitor to be in series with a parallel combination of the second capacitor and the third capacitor.

15. The circuit of claim 12 wherein the circuitry for evaluating the at least one parameter in response to the second voltage range is operable to detect a change in capacitance in the first capacitor.

16. The circuit of claim 12 wherein the circuitry for evaluating the at least one parameter in response to the second voltage range is operable to detect a change in resistive leakage in the first capacitor.

17. The circuit of claim 12 wherein the second voltage range is greater than the first voltage range.

* * * * *